United States Patent [19]
Shen et al.

[11] Patent Number: 6,166,893
[45] Date of Patent: Dec. 26, 2000

[54] SEMICONDUCTOR LOAD DRIVER CIRCUIT AND METHOD THEREFOR

[75] Inventors: Zheng Shen, Chandler; Stephen P. Robb, Tempe, both of Ariz.

[73] Assignee: Semiconductor Components Industries, LLC, Phoenix, Ariz.

[21] Appl. No.: 09/217,288

[22] Filed: Dec. 21, 1998

[51] Int. Cl.[7] .................................................. H02H 3/18
[52] U.S. Cl. ............................ 361/86; 361/79; 361/91.1; 361/91.3; 361/170
[58] Field of Search .................................. 361/152, 170, 361/187, 79, 84, 86, 91.1, 91.3, 91.7; 327/108, 110, 180, 310

[56] References Cited

U.S. PATENT DOCUMENTS

| | | | |
|---|---|---|---|
| 4,787,007 | 11/1988 | Matsumura et al. | 361/98 |
| 4,831,483 | 5/1989 | Matsumura et al. | 361/98 |
| 5,138,516 | 8/1992 | Chapman | 351/18 |
| 5,438,286 | 8/1995 | Pavlin et al. | 327/50 |
| 5,510,950 | 4/1996 | Bills et al. | 361/93 |
| 5,793,127 | 8/1998 | Qualich | 307/125 |
| 5,818,678 | 10/1998 | Berg et al. | 361/152 |

*Primary Examiner*—Michael J. Sherry
*Attorney, Agent, or Firm*—Michael T. Wallace

[57] ABSTRACT

A load driver circuit (10) includes an output driver (11) suitable for driving an inductive load (13). An output clamp circuit (15) clamps the output (12) to a high voltage during turn-off of the output driver (11). An open load detect circuit (26) clamps the output (12) to a lower voltage when the load (13) has an open circuit fault. A power fault voltage detect circuit (28) clamps the output (12) to another low voltage during a power fault condition.

19 Claims, 1 Drawing Sheet

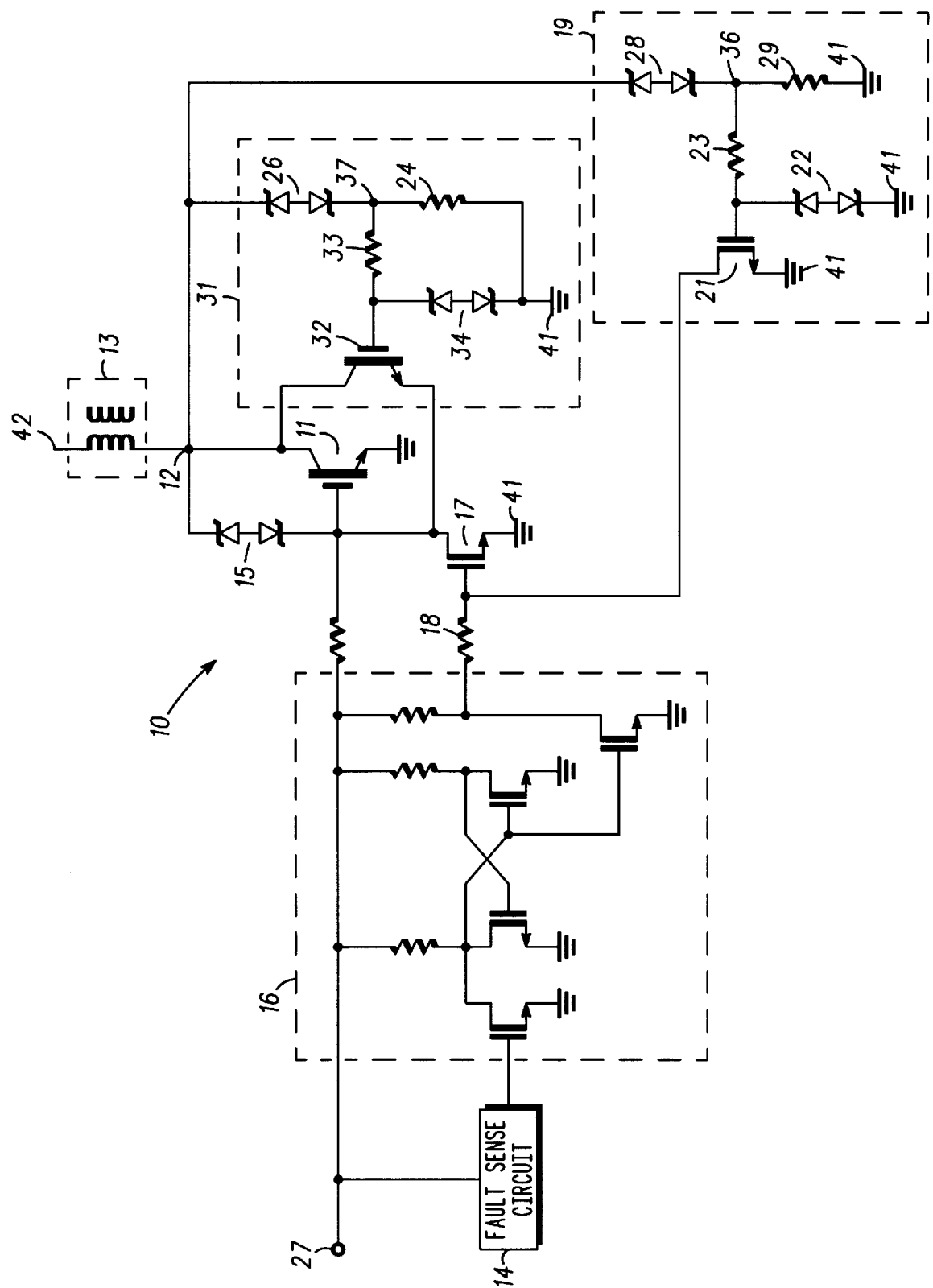

SEMICONDUCTOR LOAD DRIVER CIRCUIT AND METHOD THEREFOR

BACKGROUND OF THE INVENTION

This applicaton is related to an application entitled "Method of Driving a Load and Semiconductor Load Driver Circuit Therefor" filed by the same inventors concurrently with this application.

The present invention relates, in general, to semiconductor devices, and more particularly, to circuits for driving loads.

In the past, the semiconductor industry has utilized various circuit configurations to drive loads that are external to the semiconductor device. Inductive and capacitive loads typically require circuitry to compensate for electrical conditions that occur during the termination or initiation of current flow through the load. Of particular interest is circuits that are utilized to drive inductive loads such as ignition coils of internal combustion engines. Often, fault conditions occur during operation of the engines that can cause damage to the semiconductor device driving the ignition coil. For example, a power fault condition can occur when the semiconductor device driving the load remains in the on state for an extended period of time causing high power dissipation within the semiconductor device. This condition can occur during starting of an engine when excessive dwell times may occur. One prior solution is to quickly turn-off the semiconductor device by removing the drive signal when some excessive current level is reached. However, turning-off the semiconductor device can produce a spark that is not properly timed to the engine thereby causing damage to the engine.

Another fault condition that can cause excessive power dissipation within the semiconductor device driving the ignition coil occurs when the ignition coil cannot properly discharge the energy stored within the coil. This can occur during an open secondary or open load condition such as when a spark plug is disconnected or becomes fouled. This type of open secondary or open load condition results in the energy stored within the ignition coil being dissipated within the semiconductor device driving the ignition coil. The excessive energy can damage the semiconductor device. Alternately, the semiconductor device may be made larger in order to handle the excess power, however, this increases the cost of the semiconductor device.

Accordingly, it is desirable to have a semiconductor device and method that can limit or eliminate current supplied to the ignition coil when a power fault condition occurs without producing a spark that would damage the engine, and that can limit power dissipated by the circuit during an open load condition.

BRIEF DESCRIPTION OF THE DRAWING

The sole FIGURE schematically illustrates a semiconductor load driver circuit in accordance with the present invention.

DETAILED DESCRIPTION OF THE DRAWING

The sole FIGURE schematically illustrates a load driver circuit 10 that can sense a power fault condition and terminate current flow to a load such as an ignition coil without causing an ignition spark, and can also sense an open load condition and reduce power dissipated by circuit 10 during the open load condition. Circuit 10 includes an output driver 11 that is coupled to drive or control a load 13. Driver 11 can be a variety of transistor types that are used to drive loads such as an insulated gate bipolar transistor (IGBT), a bipolar transistor, or a metal oxide semiconductor field effect transistor (MOSFET). Driver 11 has a first current carrying electrode that functions as an output and is connected to an output node 12 of circuit 10, a second current carrying electrode connected to a power return 41, and a control electrode that is connected through a resistor to receive an input signal that is applied to an input terminal or input 27 of circuit 10. Load 13 can be a variety of inductive, capacitive, or other types of loads that can be driven by circuit 10. In the preferred embodiment, driver 11 is an IGBT. In this preferred embodiment, the first current carrying electrode is a collector, the second current carrying electrode is an emitter, and the control electrode is a gate of the IGBT. Also in the preferred embodiment, load 13 is an ignition coil, of an internal combustion engine, and has a primary that is connected between a power source or power supply 42 and output node 12, and also has a secondary that is connected to a spark plug of the engine (not shown).

An output protect circuit 15 is connected between node 12 and the control electrode of driver 11 in order to limit or clamp to a flyback voltage or first voltage the output or first current carrying electrode of driver 11 in order to prevent damage to driver 11. This also limits the voltage that is applied between the control electrode and the first current carrying electrode of driver 11. The flyback voltage is selected to be a value that provides sufficient voltage across load 13 to provide the desired voltage in the secondary of load 13. When circuit 15 becomes active, it provides a current path to discharge load 13 thereby keeping node 12 at the flyback voltage or first voltage. In the preferred embodiment, circuit 15 is a series of back to back zener diodes having a zener voltage of six to eight volts and is formed as a series of alternating strips of P-N doped polysilicon and has a voltage of approximately four hundred volts.

Circuit 10 also includes a power fault sense circuit 14 and a fault storage element 16 that are utilized to sense a power fault condition. Circuit 14 senses the power dissipated by driver 11 or circuit 10 by sensing the temperature of circuit 10 or the amount of current supplied to a current carrying electrode of driver 11. In the preferred embodiment, circuit 14 can sense the current in either the emitter or the collector of an IBGT used for driver 11. When a selected value of the temperature or current exceeds a value selected as the power fault value, then circuit 14 sets an output to a level indicating the power fault condition. Circuit 14 can be a variety of temperature or current sensing circuits that are well known to those in the art. For example, circuit 14 can include a temperature sensing diode, a temperature sensing diode transistor, a current mirror to sense current, or a current sense circuit similar to that used in SenseFET power MOSFETs manufactured by Motorola, Inc and International Rectifier, Inc. Additionally, element 16 is coupled to circuit 14 for storing the value supplied on the output of circuit 14. Element 16 typically is four transistors coupled together in a cross-coupled latch configuration so that the value of the output of circuit 14 is stored in element 16.

A fault turn-off device 17 and a fault control loop 19 are utilized to provide a soft turn-off of driver 11 during the power fault condition. Device 17 typically is a transistor that is compatible with the type of transistor utilized for driver 11. In the preferred embodiment, device 17 is a MOSFET. Device 17 is coupled to turn-off driver 11 in response to power dissipated by driver 11 and circuit 10. Device 17 has a first current carrying electrode coupled to the control electrode of driver 11, a second current carrying electrode coupled to power return 41, and a control electrode that is responsive to the power dissipated by driver 11 or circuit 10. The control electrode is coupled through a coupling resistor 18 to the output of element 16.

Loop 19 is responsive to the voltage on output node 12 and controls the turn-off rate of driver 11 by controlling the amount of drive supplied to device 17 as will be seen hereinafter. Loop 19 includes a fault voltage detect circuit 28 that is coupled between output node 12 and a loop node 36 that is responsive to the voltage on node 12 as will be seen hereinafter. Node 36 is connected to power return 41 through a sustaining resistor 29. Loop 19 also includes a fault control device 21 that is compatible with the type of semiconductor element used for device 17. In the preferred embodiment, device 21 is a MOSFET. Device 21 has a first current carrying electrode connected to the control electrode of device 17, a second current carrying electrode connected to power return 41, and a control electrode that is connected through a fault resistor 23 to loop node 36. A fault protection device 22 is connected between the control electrode of device 21 and return 41 in order to ensure that the voltage applied to the control electrode does not damage device 21. Device 22 typically is a series of back to back zener diodes each having zener voltages of 7.5 volts and are formed as alternating strips of P-N doped polysilicon. The voltage utilized for device 22 is lower than the voltage that will damage device 21.

Circuit 10 also includes an open load control loop 31 that senses an open load condition during the turn-off of driver 11 and applies a voltage to the input of driver 11 that reduces the power dissipated by driver 11 and circuit 10. Open load control loop 31 is responsive to the voltage on output node 12. Loop 31 includes an open load device 32 that is used for applying a voltage to the control electrode of driver 11 to make driver 11 more conductive in order to lower the voltage at node 12. Device 32 is a semiconductor element that is compatible with the type of semiconductor element used for driver 11. In the preferred embodiment, device 32 is an IGBT connected between the gate and collector of driver 11. Device 32 has a first current carrying electrode connected to output node 12, a second current carrying electrode connected to the control electrode of driver 11, and a control electrode that is connected to a loop node 37 through a open load resistor 33. An open load protection device 34 is utilized to protect device 32 and ensure that voltage applied to the control electrode of device 32 does not damage device 32. Device 34 is connected between power return 41 and the control electrode of device 32. Device 34 is fabricated similarly to device 22.

Loop 31 also includes an open load detect circuit 26 that is coupled between output node 12 and, through an open load sustaining resistor 24, to power return 41. As will be seen hereinafter, the value of resistor 33 is chosen to provide a turn-on delay for turning-on device 32. The turn-on time is selected to be longer than the time that driver 11 is required to be on in order to provide proper operation of load 13. Thus, loop 31 is not active during normal operation of circuit 10. Typically, driver 11 is on for twenty to thirty micro seconds. In the preferred embodiment, resistor 33 has a value of approximately ten meg-ohms to turn-on device 32 approximately fifty micro seconds after driver 11 turns on. Resistor 24 has a resistance of approximately forty thousand ohms in order to provide the proper amount of current to circuit 26. Also, circuit 26 has a turn-on voltage less than the voltage of circuit 15, for example approximately twenty volts, to provide a desired low power dissipation as will be seen hereinafter In normal operation without a power fault or open load condition, an input signal is applied to terminal 27 to turn-on driver 11 and cause current flow through the primary of load 13. At some time later, the input signal is changed to turn-off driver 11. During the turn-off, energy stored within load 13 causes the voltage on node 12 to increase until reaching the first voltage or the flyback voltage of circuit 15. Load 13 substantially maintains the voltage at node 12 at a value to keep current flowing through circuit 15 until all of the energy in load 13 is dissipated. Typically, loop 31 is not activated because the energy stored in load 13 is dissipated before the time delay of loop 31 is complete.

During an open load condition, loop 31 becomes active. When the first signal is applied to input 27 to turn-off driver 11, the energy in load 13 increases the voltage on output node 12. Because there is no load connected to load 13, the voltage continues to increase until the voltage on node 12 reaches the first voltage or flyback voltage and load 13 begins to discharge. The voltage of circuit 26 is less than the voltage of circuit 15. As the voltage on node 12 passes through the open load detect voltage or second voltage that is established by circuit 26, circuit 26 begins to conduct current through resistor 24. As indicated hereinbefore, resistor 33 provides a time delay that prevents device 32 from turning on until after a first time period after driver 11 begins turning off. The first time period is selected to be sufficient to guarantee load 13 will develop a spark as indicated hereinbefore. After this first time period, device 32 becomes active thereby supplying additional current to driver 11 thereby making driver 11 more conductive. Because the voltage of circuit 26 is less than that of circuit 15, the inductor of load 13 only has to maintain the voltage of circuit 26 at node 12 in order to keep driver 11 conducting current from load 13. Thus, loop 31 applies a lower flyback voltage or second voltage that is less than the first voltage and this lower voltage appears across driver 11 lowering the power dissipated within driver 11. The voltage of circuit 26 is selected to be sufficiently less than the voltage of circuit 15 to reduce the voltage between the first and second current carrying electrodes thereby reducing the amount of power dissipated by driver 11. Consequently, the size of driver 11 can be smaller for an average power dissipation specification of driver 11 because the peak power dissipation requirement of driver 11 is less, thereby reducing the cost of driver 11 and circuit 10.

During a power fault condition, loop 19 allows driver 11 to turn off at a first rate until the voltage on node 12 reaches the flyback voltage or first voltage, and then loop 19 turns-off driver 11 at a second rate that substantially maintains the voltage on node 12 at the first value until the energy in load 13 is dissipated. However, if an open load condition occurs simultaneously with a power fault condition loop 19 will substantially maintain the voltage on node 12 at the first value. Under these conditions, loop 31 has no effect unless the voltage value of circuit 26 is equal or less than the voltage value of circuit 28. If the circuit 26 voltage is equal or less, until loop 31 couples the second voltage to the input of driver 11 at which time loop 31 will maintain node 12 at substantially the second voltage.

During a power fault condition, circuit 14 senses the power fault condition, and element 16 stores an indication of the power fault condition. The output of element 16 enables device 17 which begins to reduce drive current to the control electrode of driver 11 in order to turn-off driver 11 at a first rate. Consequently, device 17 begins turning driver 11 off even though the input signal is still applied to the control electrode of driver 11. As driver 11 begins to turn-off, the voltage at node 12 increases until it reaches the fault detect voltage established by circuit 28 at which time circuit 28 conducts current from load 13 through resistor 29 and also provides current through resistor 23 to turn-on device 21. Device 21 begins to turn-on and begins reducing drive current to device 17 which in turn allows more drive current to be supplied to driver 11 which turns-on slightly to conduct current from load 13 to return 41. This turns-off driver 11 at a second rate that is different than the first rate. Typically, the first rate is approximately the same rate as a normal turn-off of driver 11, and the second rate is approximately ten to twenty times slower than the normal turn-off of driver 11 in order to avoid load 13 generating an unwanted spark. Loop 19 and device 17 function together to control driver 11 to discharge load 13 while the voltage at node 12 remains substantially constant at the fault detect voltage. Typically, node 12 varies less than about ten per cent (10%) from the fault detect voltage during this discharge of load 13.

The voltage of circuit 28 is selected to be a value that is greater than the value of power supply 42 but low enough to prevent a voltage developing in the secondary of load 13 that is high enough to develop a spark. In the preferred embodiment, circuit 28 is set to have a voltage value of twenty volts and power supply 42 has a voltage of twelve volts.

During normal operation without a power fault condition, device 17 is not turned-on by element 16, therefore it has no effect on driver 11. However, circuit 28 and resistor 29 will conduct current during normal operation and turn-on device 21 even though this has no effect on the operation of driver 11. Circuit 28 and resistor 29 must be fabricated to handle the currents required during these normal operation conditions.

By now it should be apparent that there has been provided a novel load driver circuit. Sensing an open load condition and utilizing a lower protection voltage during open load conditions than normal conditions reduces the power dissipation of the circuit thereby allowing the circuit to be smaller which reduces the cost of the circuit. Controlling the rate at which the output driver turns off during a power fault condition also reduces the power dissipated by the circuit thereby providing a more reliable device.

Although described as driving an ignition coil, circuit 10 can drive a variety of load types including other inductive loads and capacitive loads. Additionally, either loop 19 or loop 31 can be used alone with the other loop.

What is claimed is:

1. A method of controlling a load driver circuit during an open load condition comprising:
    forming an output driver with a protection device coupled to clamp an output of the output driver to a first voltage when turning-off the output driver, the output coupled to an output node of the load driver circuit; and
    coupling an open load control loop to the output driver, the open load control loop responsive to an open load condition while the output driver is turning-off and coupled to clamp the output of the output driver to a second voltage that is less than the first voltage in response to the open load condition.

2. The method of claim 1 wherein coupling the open load control loop to the output driver, the open load control loop responsive to the open load condition while the output driver is turning-off includes maintaining the output at a first voltage for a first time period when turning-off of the output driver.

3. The method of claim 2 wherein coupling the second voltage that is less that the first voltage includes maintaining the output node at the second voltage for a second time period after the first time period.

4. The method of claim 3 wherein coupling the second voltage that is less than the first voltage includes clamping a voltage between the output node and a control electrode of the output device to the first voltage and clamping the output node to the second voltage after the first time period.

5. The method of claim 1 wherein coupling the open load control loop to the output driver, the open load control loop responsive to the open load condition while the output driver is turning-off and coupled to clamp the output of the output driver to the second voltage that is less that the first voltage in response to the open load condition includes coupling the second voltage that is responsive to a voltage on the output node.

6. The method of claim 1 further including coupling the output to an inductive load.

7. A load driver circuit comprising:
    an output node;
    a power return;
    a power source;
    a loop node responsive to a voltage on the output node;
    a output driver having a control electrode, a first current carrying electrode coupled to the output node, and a second current carrying electrode coupled to the power return;
    a fault turn-off device having a first current carrying electrode coupled to the control electrode of the output driver, a second current carrying electrode coupled to the power return, and a control electrode responsive to power dissipated by the output device;
    a fault control device having a first current carrying electrode coupled to the power return, a second current carrying electrode coupled to the control electrode of the fault turn-off device, and a control electrode that is responsive to the voltage on the output node;
    a fault protection device having a first electrode coupled to the power return and a second electrode coupled to the control electrode of the fault control device;
    a fault resistor having a first electrode coupled to the loop node and a second electrode coupled to the fault protection device; and
    a fault control loop responsive to a voltage on the output node for reducing drive to the fault turn-off device for controlling a turn-off rate of the output driver.

8. A load driver circuit comprising:
    an output node;
    a output driver having a first current carrying electrode coupled to the output node, a control electrode coupled to receive an input signal, and a second current carrying electrode;
    an open load control loop responsive to a voltage on the output node for applying a voltage to the control electrode of the output driver a first period of time after the output driver is turned-on; and
    an open load device responsive to the voltage on the output node and coupled to apply the voltage to the control electrode of the output driver to control the voltage at the output node.

9. The load driver circuit of claim 8 wherein the open load device includes an open load transistor having a first current carrying electrode coupled to the output node, a second current carrying electrode coupled to the control electrode of the output driver, and a control electrode responsive to the voltage on the output node.

10. The load driver circuit of claim 9 wherein the open load control loop includes an open load protection device having a first electrode coupled to a power return and a second electrode coupled to the control electrode of the open load transistor.

11. The load driver circuit of claim 10 further including a resistor having a first electrode coupled to a loop node and a second electrode coupled to the open load protection device.

12. The load driver circuit of claim 11 wherein the open load protection device is a plurality of zener diodes that provide a breakdown voltage that is less than a breakdown voltage of the control electrode of the open load transistor.

13. The load driver circuit of claim 8 further including a fault turn-off device coupled to turn-off the output driver in response to power dissipated by the output driver; and a fault control loop responsive to the voltage on the output node for reducing drive to the fault turn-off device for controlling a turn-off rate of the output driver.

14. The load driver circuit of claim 13 wherein the fault control loop includes a fault control transistor having a first current carrying electrode coupled to a power return, a second current carrying electrode coupled to reduce drive to the fault turn-off device, and a control electrode that is responsive to the voltage on the output node.

15. The load driver circuit of claim 13 wherein the fault turn-off device includes a fault turn-off transistor having a first current carrying electrode coupled to the control electrode of the output driver, a second current carrying electrode coupled to a power return, and a control electrode responsive to power dissipated by the output driver.

16. The load driver circuit of claim 15 further including a fault sense circuit coupled to sense power dissipated by the output driver, the fault sense circuit having an output; and a fault storage element coupled to store a value of the output of the fault sense circuit, the fault storage element having an output coupled to a control electrode of the fault turn-off transistor.

17. The load driver circuit of claim 15 wherein the fault control loop further includes a loop node responsive to the voltage on the output node, a fault control transistor having a control electrode, and a fault protection device having a first electrode coupled to the power return and a second electrode coupled to the control electrode of the fault control transistor.

18. The load driver circuit of claim 17 wherein the fault protection device is a plurality of zener diodes that provide a breakdown voltage that is less than a breakdown voltage of the control electrode of the fault control transistor.

19. The load driver circuit of claim 17 further including a fault resistor having a first electrode coupled to the loop node and a second electrode coupled to the second electrode of the fault protection device.

* * * * *